United States Patent
Berge et al.

(10) Patent No.: US 10,684,319 B2
(45) Date of Patent: *Jun. 16, 2020

(54) TUNING A TESTING APPARATUS FOR MEASURING SKEW

(71) Applicant: International Business Machines Corporation, Armonk, NY (US)

(72) Inventors: Layne A. Berge, Rochester, MN (US);
Benjamin A. Fox, Rochester, MN (US);
Wesley D. Martin, Elgin, MN (US);
David W. Siljenberg, Byron, MN (US);
George R. Zettles, IV, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 313 days.

This patent is subject to a terminal disclaimer.

(21) Appl. No.: 14/803,685

(22) Filed: Jul. 20, 2015

(65) Prior Publication Data

US 2017/0023629 A1    Jan. 26, 2017

(51) Int. Cl.
*G01R 31/11*     (2006.01)
*G01R 31/317*    (2006.01)
(Continued)

(52) U.S. Cl.
CPC ........ *G01R 31/11* (2013.01); *G01R 31/31725* (2013.01); *G01R 31/31727* (2013.01);
(Continued)

(58) Field of Classification Search
CPC .. G01R 31/11; G01R 31/021; G01R 31/3191; G01R 31/31725; G01R 31/31905; G01R 31/31937
(Continued)

(56) References Cited

U.S. PATENT DOCUMENTS 5,586,054 A * 12/1996 Jensen ................... G01R 31/11
324/512
6,192,496 B1 * 2/2001 Lawrence .......... G01R 31/3191
324/73.1

(Continued)

FOREIGN PATENT DOCUMENTS

JP     2009109345 A     5/2009

OTHER PUBLICATIONS

U.S. Appl. No. entitled "Tuning a Testing Appartaus for Measuring Skew," U.S. Appl. No. 14/803,326, filed Jul. 20, 2015.

(Continued)

*Primary Examiner* — James C Kerveros
(74) *Attorney, Agent, or Firm* — Patterson + Sheridan, LLP

(57) ABSTRACT

Embodiments herein discuss tuning a testing apparatus to better match the input response of a target system in which a cable will be used. For example, conductors in the cable may have a different skew depending on the system in which they are used. The testing apparatus may be tuned using frequency information regarding the type of signals that will be driven on the cable when installed in the target system. In one embodiment, the testing apparatus adjusts a testing cycle refresh rate for generating a testing signal which changes the frequency content of the testing signal. Using the adjusted testing cycle refresh rate results in the driver outputting a testing signal that better reflects the actual signals that will be transmitted on the cable in the target system.

20 Claims, 6 Drawing Sheets

(51) Int. Cl.
*G01R 31/3193* (2006.01)
*G01R 31/319* (2006.01)

(52) U.S. Cl.
CPC .... *G01R 31/31937* (2013.01); *G01R 31/3191* (2013.01); *G01R 31/31709* (2013.01); *G01R 31/31905* (2013.01)

(58) Field of Classification Search
USPC .......................................... 714/700; 324/533
See application file for complete search history.

(56) References Cited

U.S. PATENT DOCUMENTS

| | | | |
|---|---|---|---|
| 6,437,578 B1 | 8/2002 | Gumm | |
| 6,658,604 B1* | 12/2003 | Corbin | G01R 31/3016 713/400 |
| 6,784,819 B2 | 8/2004 | Chow | |
| 6,862,546 B2 | 3/2005 | Kaburlasos et al. | |
| 6,992,491 B1 | 1/2006 | Lo et al. | |
| 7,026,825 B1 | 4/2006 | Lo et al. | |
| 7,188,037 B2* | 3/2007 | Hidehira | G01R 31/2806 324/501 |
| 7,282,922 B2* | 10/2007 | Lo | G01R 31/11 324/533 |
| 7,336,113 B2 | 2/2008 | Laletin | |
| 7,337,079 B2* | 2/2008 | Park | G01R 31/088 324/539 |
| 7,532,011 B2 | 5/2009 | Shi | |
| 7,671,617 B2* | 3/2010 | Song | G01R 31/318513 324/756.07 |
| 7,893,695 B2* | 2/2011 | Roth | G01R 31/31905 324/533 |
| 7,982,467 B2 | 7/2011 | Harres | |
| 8,103,917 B2* | 1/2012 | Jang | G11C 29/02 714/700 |
| 8,184,723 B2* | 5/2012 | DiSanto | G09G 5/006 324/543 |
| 8,222,906 B2 | 7/2012 | Wyar et al. | |
| 8,265,232 B2 | 9/2012 | Lindqvist | |
| 8,474,320 B2* | 7/2013 | Kordon | G01R 31/083 324/536 |
| 2004/0245995 A1* | 12/2004 | Williams | H04N 17/00 324/512 |
| 2005/0168229 A1 | 8/2005 | Onodera | |
| 2005/0270037 A1* | 12/2005 | Haynes | G01R 31/088 324/603 |
| 2006/0038573 A1* | 2/2006 | Sarkozi | G01R 31/1272 324/536 |
| 2007/0101219 A1 | 5/2007 | Jang et al. | |
| 2009/0109047 A1* | 4/2009 | Seki | H04J 3/0682 340/653 |
| 2009/0219980 A1* | 9/2009 | DiSanto | G09G 5/006 375/224 |
| 2009/0284264 A1* | 11/2009 | Ng | G01R 31/083 324/525 |
| 2010/0141264 A1* | 6/2010 | Ravot | G01R 31/11 324/533 |
| 2010/0153792 A1 | 6/2010 | Jang | |
| 2012/0306510 A1* | 12/2012 | White | G01R 31/021 324/551 |
| 2013/0006560 A1* | 1/2013 | Cern | G01R 31/1272 702/66 |
| 2013/0093434 A1* | 4/2013 | Peyton | H04M 3/34 324/628 |
| 2013/0204555 A1* | 8/2013 | Scheuschner | G01R 23/16 702/59 |
| 2016/0139194 A1* | 5/2016 | Cohen | G01R 31/088 324/533 |

OTHER PUBLICATIONS

International Business Machines Corporation, "List of Patents and Patent Applications as Related", filed Feb. 10, 2017.

* cited by examiner

TUNING A TESTING APPARATUS FOR MEASURING SKEW

BACKGROUND

The present invention relates to measuring skew between signals transmitted on two conductors, and more specifically, to tuning a testing apparatus used to measure the skew.

A testing apparatus such as a time-domain reflectometer (TDR) may be used to measure skew between signals transmitted on two conductors. Generally, skew is a misalignment of signals propagating in a conductive material. Skew may be caused by many different factors such as wire-interconnect length, temperature variations, variation in intermediate device, capacitive coupling, material imperfections, and the like. Cable vendors may use a TDR to test skew in cables that include multiple conductors. The skew caused by the cables represents the misalignment between signals that are transmitted on one end of the conductors at the same time but arrive at different times at the opposite ends of the conductors. Accurately measuring skew is important for many applications such as transmitting differential signals or data and clock signal synchronization.

When testing skew using a TDR, the characteristics of the signal used to measure the skew are important. For example, the frequency and power at which the TDR drives a signal onto a cable affect the skew measurement. Typically, cable vendors use the same standardized testing signal to determine the skew of a cable regardless of the intended use of the cable—e.g., the type of data, the frequency of the data signals, the power used to drive the data signals, and the like.

SUMMARY

One embodiment of the present invention is a method that adjusting a testing cycle refresh rate for generating a testing signal, where adjusting the testing cycle refresh rate changes the frequency content of the testing signal. The method includes driving the testing signal using the adjusted testing cycle refresh rate onto a plurality of conductors. The method also includes measuring skew associated with the plurality of conductors in response to driving the testing signal.

Another embodiment of the present invention is a testing apparatus that includes logic configured to adjust a testing cycle refresh rate for generating a testing signal, where adjusting the testing cycle refresh rate changes the frequency content of the testing signal. The testing apparatus includes a driver configured to drive the testing signal generated using the adjusted testing cycle refresh rate onto a plurality of conductors and a skew calculator configured to measure skew associated with the plurality of conductors in response to driving the testing signal.

Another embodiment of the present invention is a computer program product for testing a plurality of conductors that includes computer-readable program code executable by one or more computer processors to adjust a testing cycle refresh rate for generating a testing signal, wherein adjusting the testing cycle refresh rate changes the frequency content of the testing signal. The program code is further executable to drive the testing signal using the adjusted testing cycle refresh rate onto the plurality of conductors and measure skew associated with the plurality of conductors in response to driving the testing signal.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
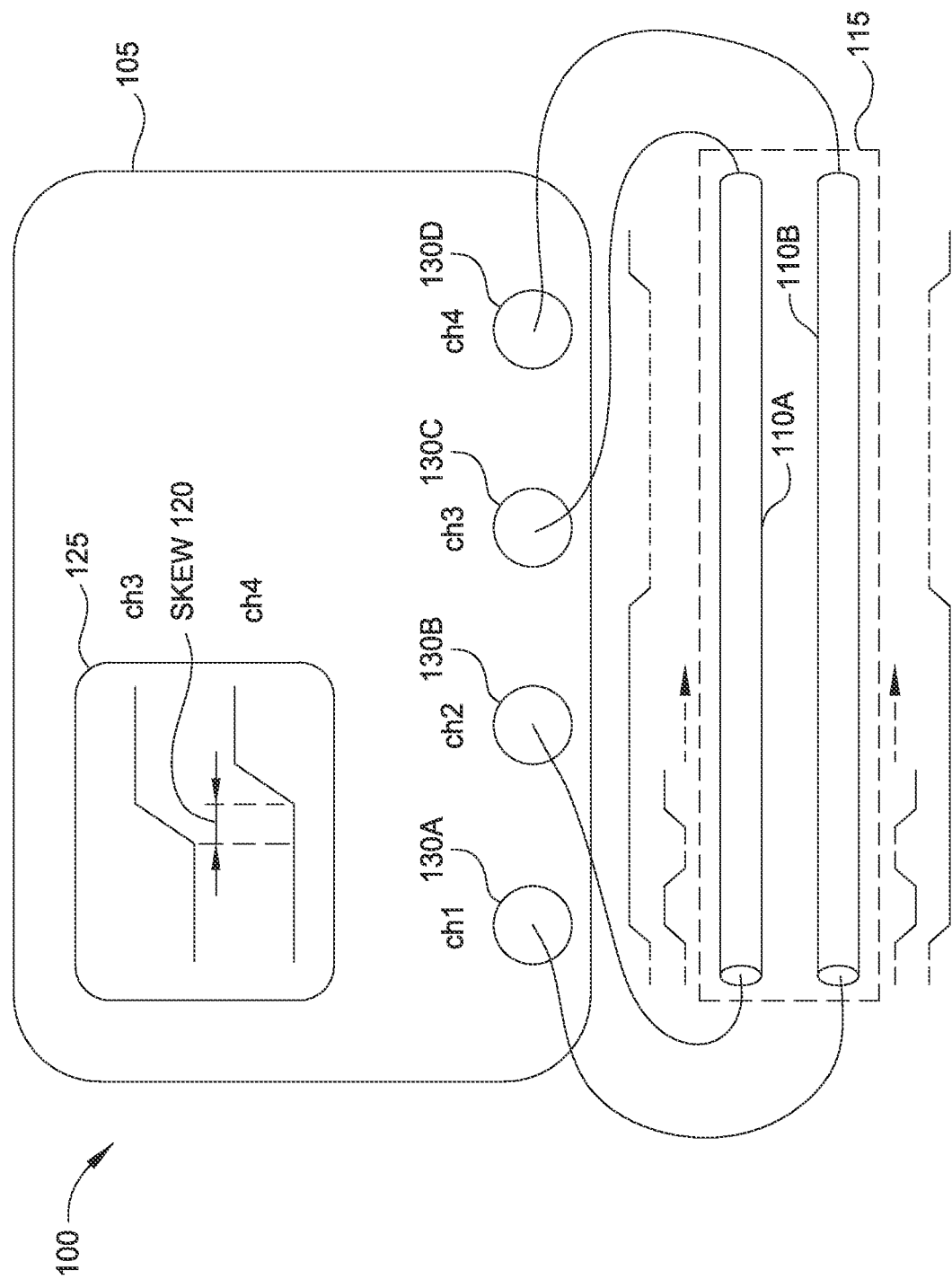
FIG. 1 illustrates a testing apparatus for measuring skew, according to one embodiment described herein.

Server applications often have multiple computing devices arranged in a rack that are interconnected using cables of different lengths and specifications. As the length of the cables increase, driving the data on the cable at the desired speed and with the desired edge rate (rise time) becomes more difficult. Industry standard committees for different signal interfaces have defined specifications that must be met by cables that transmit data to and from these interfaces. A cable vendor may use a testing apparatus such as a time-domain reflectometer (TDR) to ensure each cable meets the specifications defined in one of the industry standard. If a particular cable does not meet this standard, it is scrapped.

The testing methodology used to measure the specifications of a cable (e.g., its skew) must be accurate or a cable may be erroneously scrapped leading to waste. For example, one methodology includes using a TDR to transmit a testing signal with a high frequency edge (e.g., 25 GHz transition) and a 1 kHz refresh rate which results in the bulk of the power of the testing signal residing at lower frequencies—e.g., less than 1 GHz. As will be described in more detail below, this methodology does not match the reality of many modern computing systems where data signals have shifted from speeds in the kHz range to speeds in the MHz/GHz bands.

In one embodiment, before testing a cable, the testing apparatus is tuned to better match the input response of a target computing system in which the cable will be used. For example, the conductors in a cable may have a different skew depending on the target system in which it is used. Thus, using the same methodology to test all the cables without considering the intended use of the cable can result in erroneously concluding that a cable does not meet the specifications of the data interfaces in the target system (or erroneously concluding the cable does meet the specifications) when in fact the opposite is true. To more accurately measure the specifications of the cable, the testing apparatus may be tuned using frequency information regarding the type of signals that will be driven on the cable when installed in the target system. For example, the frequency information may include a frequency profile of a transmitter in the target system, a desired frequency of the target system, an impulse response of a channel that will include the cable, and/or an S-parameter of the channel. Using the frequency information, the testing apparatus tunes an output driver to drive signals on the cable that better match the actual signals that will be used in the target system.

The testing apparatus may include a programmable clock source which can be used to shape a reference clock that controls the driver. In one embodiment, the testing apparatus uses the frequency information to program the clock source to generate a clock signal that sufficiently matches the frequency information according to one or more criteria. Using digital signal processing, the testing apparatus processes the reference clock signal using the programmed clock source to generate a modified clock signal that better represents the actual signal (relative to the unmodified reference clock) that will be transmitted on the cable in the target system. The testing apparatus uses the modified clock signal to control the driver and measure the resulting skew. This skew measurement may more accurately represent the performance of the cable when used in the target system relative to using a testing apparatus that is not tuned.

FIG. 1 illustrates a testing apparatus 105 for measuring skew, according to one embodiment described herein. The testing environment 100 includes the testing apparatus 105 (e.g., a TDR) and two conductors 110A and 110B. In one embodiment, the conductors 110 (e.g., wires) are in a cable 115 which may be any length. For example, the testing apparatus 105 may measure skew to determine the signal quality of transmitting a differential pair signal in the two conductors 110 of the cable 115. However, in another embodiment, the conductors 110 may be two traces on a common PCB where conductor 110A is used to transmit a clock signal and conductor 110B is used to transmit data signals to one or more memory modules.

To measure the skew between signals transmitted through the conductors 110, the testing apparatus 105 includes four channels 130. Channels 130A, 130B represent transmitters for driving testing signals onto first ends of the respective conductors 110, while channels 130C, 130D represent receivers for measuring when the testing signals reach second ends of the conductors 110. Although the testing apparatus 105 may drive the testing signal onto the conductors 110 at the same time using channels 130A, 130B, the edges in the testing signal may arrive at different times at the channels 130C, 130D, resulting in skew.

The testing apparatus 105 includes a display 125 or a display interface for outputting a visual representation of the skew 120 measured by the channels 130C, 130D. As shown here, the testing signal propagates more quickly through conductor 110A than conductor 110B, thereby resulting in the edge (or transition) in the testing signal being detected on channel 130C sooner than channel 130D. The testing apparatus 105 outputs a skew measurement (e.g., 100 ps) which represents the time between when an edge reaches the second end of conductor 110A and when that same edge reaches the second end of conductor 110B.

In one embodiment, the testing apparatus 105 processes the signals received at channels 130C, 130D before outputting the skew 120 on the display 125. However, if the signal strength of the received testing signal is beneath a noise floor of the testing apparatus 105, the post-processing response is not useable, and thus, does not affect the skew measurement. As described below, this may result in inaccurate skew measurements.

Figure 2:
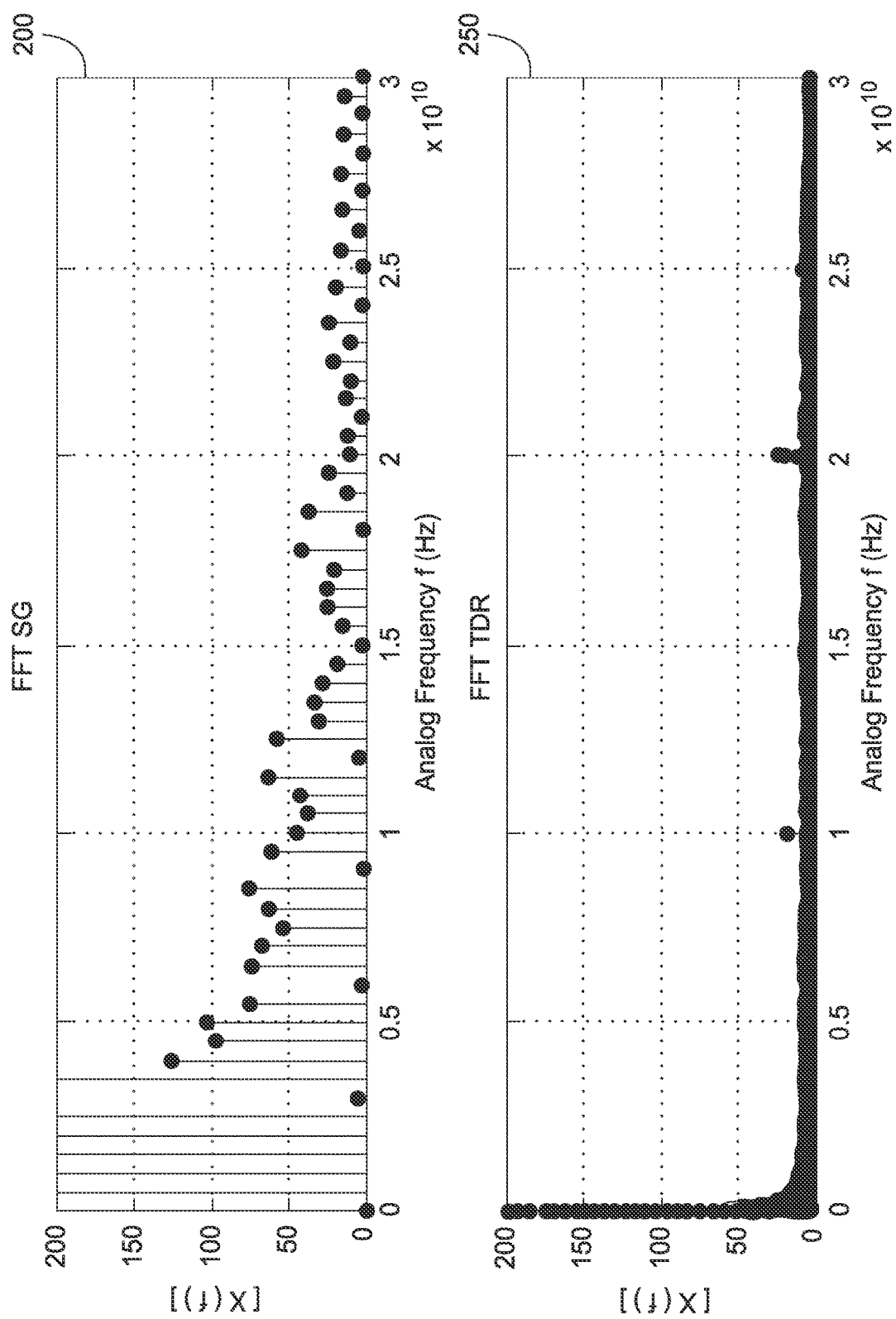
FIG. 2 illustrates frequency responses for two different testing apparatuses, according to one embodiment described herein.

FIG. 2 illustrates frequency responses for two different testing apparatuses, according to one embodiment described herein. Specifically, chart 200 illustrates the frequency response of a signal generator, while chart 250 illustrates the frequency response of a TDR that uses a 25 GHz edge that refreshes (or repeats) every 1 kHz as a testing signal. Generally, the signal outputted by the signal generator has more power in the higher frequency spectrum (e.g., frequencies greater than 2.5 GHz) than the testing signal generated by the TDR. Because of the additional power contained in the higher frequency spectrum, the signal generator outputs a signal that may more accurately reflect a signal a transmitter would output on a cable in a target computing system. In contrast, the frequency response of the TDR shown in chart 250 has very little power in the higher frequency spectrum, and thus, may not accurately reflect the transmitter in the target system which transmits signals that have more power in the higher frequency spectrum.

Figure 3:
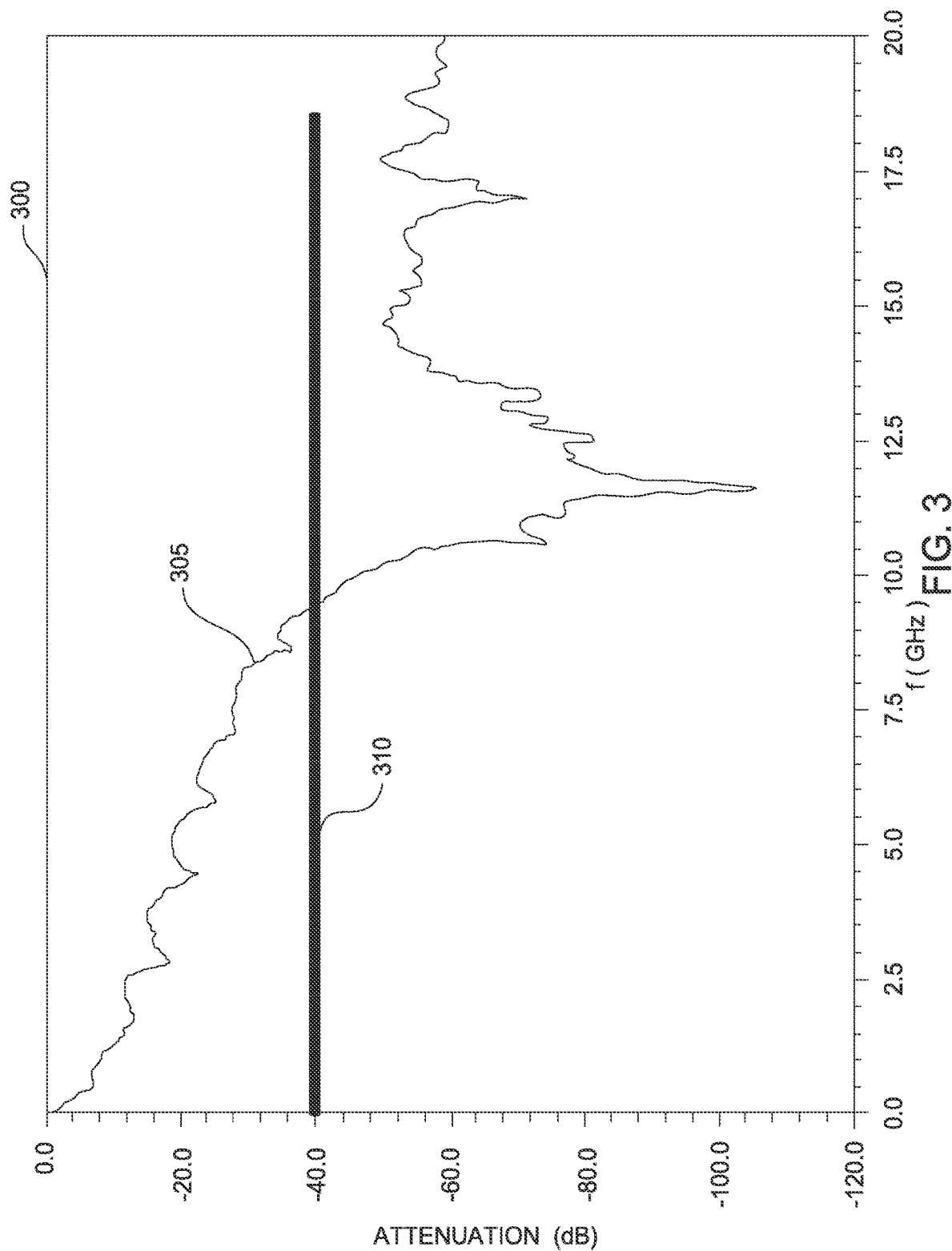
FIG. 3 illustrates cable insertion loss relative to frequency, according to one embodiment described herein.

FIG. 3 illustrates cable insertion loss relative to frequency in chart 300, according to one embodiment described herein. As shown by plot 305, the insertion loss generally increases as the frequency increases between the ranges of 0-11 GHz and then begins to stabilize at frequencies greater than 15 GHz. Moreover, chart 300 includes a hypothetical noise floor 310 for a TDR device. For signals that fall below this noise floor 310 (approximately −40 dB in this example) will be ignored by the TDR. Because higher frequencies are attenuated more by the cable, there is a risk that these frequencies will fall below the noise floor of the TDR device, and thus, are not used to calculate the skew.

Comparing chart 300 to chart 250 in FIG. 2, the TDR testing signal relies heavily on the lower frequency power of its testing signal to measure skew. Because the testing signal does not include much power at the higher frequencies (and given the propensity of a cable to attenuate the higher frequency signals), the received higher frequencies may fall below the noise floor 310, and thus, are ignored by the TDR. As a result, the skew reported by the TDR may more accurately reflect the skew when lower frequency signals (e.g., signals less than 2 GHz) are transmitted on the cable. But for differential pair signals, skew generally decreases as the frequency increases. This phenomenon is a result of the Miller effect where the signal in the slower conductor of the differential pair is pulled along by the signal in the faster conductor due to the capacitive coupling between the two conductors. Thus, the skew of the cable may be much less than what is reported by a TDR which uses the testing signal represented by the frequency response in chart 250. For example, the TDR may report the skew of 100 ps, but if the signal generator represented by the frequency response in chart 200 were used instead to drive a testing signal, the skew may be closer to 40 ps.

Figure 4:
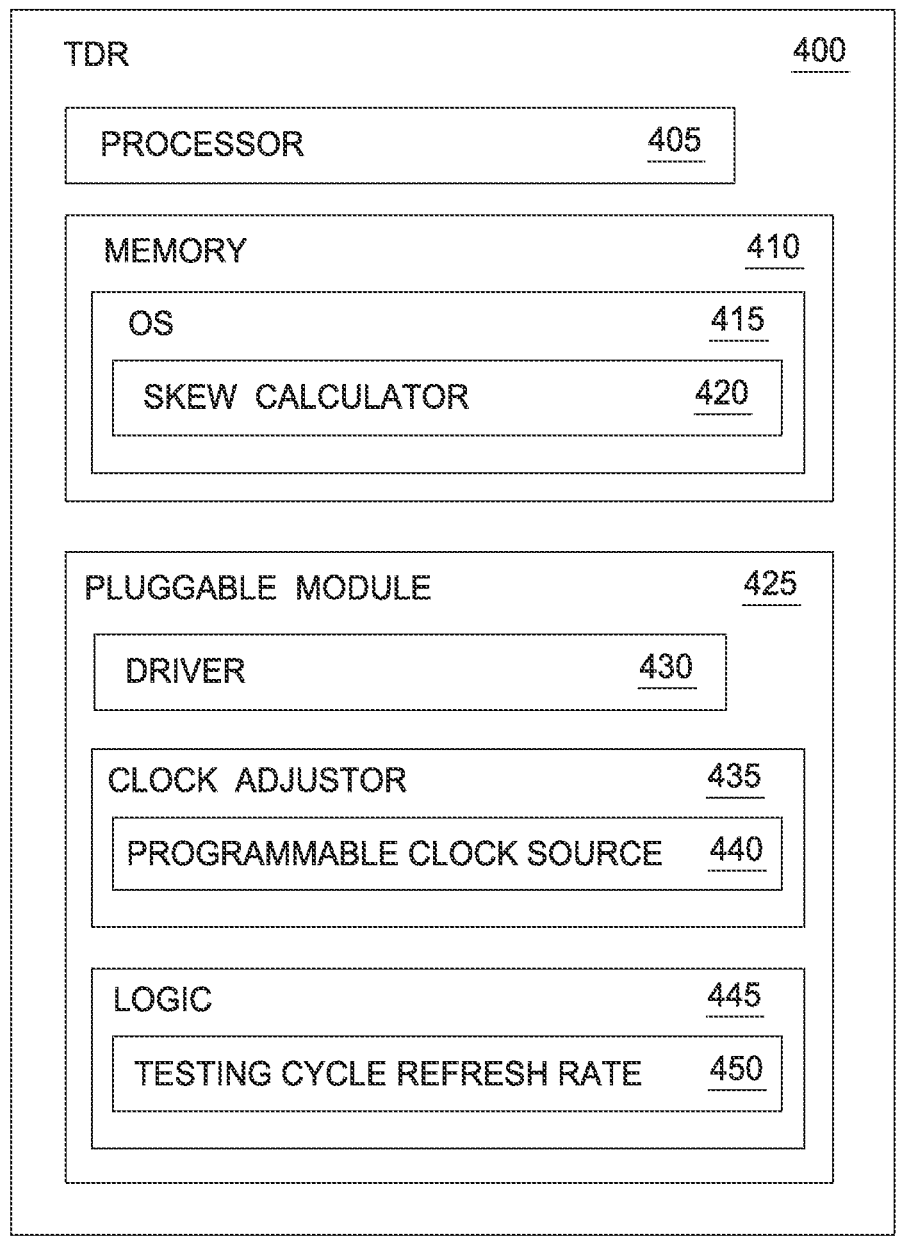
FIG. 4 illustrates a TDR with pluggable modules, according to one embodiment described herein.

FIG. 4 illustrates a TDR 400 with pluggable modules, according to one embodiment described herein. The TDR 400 includes a processor 405, memory 410, and at least one pluggable module 425 (e.g., also referred to as a TDR head). Although a TDR is shown, the embodiments herein may apply to any testing apparatus that can measure skew between two conductors.

The processor 405 may represent one or more processing elements that each includes one or more processing cores. The memory 410 may include volatile memory, non-volatile memory, or combinations thereof. Using the memory 410 and processor 405, the TDR executes an operating system (OS) 415 which may be any OS capable of performing the functions recited herein. In other embodiments, the TDR 400 may not include an operating system but instead rely on firmware and/or hardware to perform the functions described herein.

The OS 415 includes a skew calculator 420 which may be a software application that calculates skew between two conductors under test—e.g., a differential pair of conductors in a cable. Referring to FIG. 1, the skew calculator 420 may receive the testing signals acquired by the channels 130C, 130D and calculate the skew between edges in the testing signals. As mentioned above, the skew calculator 420 may have a noise floor where signals attenuated beneath this floor are ignored when the skew is calculated. However, as will be discussed below, the pluggable module 425 may be configured to drive a testing signal to prevent the signal frequencies that are of most interest—e.g., the signal frequencies most often used by the target computing system—from falling below the noise floor. Moreover, although not shown, the TDR 400 may have an input/output device such as a display (or display interface coupled to an external display) for reporting to a user the skew measured by the calculator 420.

The pluggable module 425 includes a driver 430 and a clock adjustor 435. In one embodiment, the pluggable module 425 may be a TDR head that can be inserted and removed from the exterior of the TDR 400 without having to remove a portion of the chassis in order to access the interior of the TDR 400, although this is not a requirement. For example, instead of being located on a pluggable module 425, the driver and clock adjustor 435 may be rigidly attached to the chassis of the TDR 400 such that these elements are not removable from the TDR 400 in a modular fashion. The advantage of the pluggable module 425, however, is that the driver 430 and clock adjustor 435 can be used to upgrade existing TDRs without having to purchase an entirely new TDR.

In one embodiment, the driver 430 includes circuitry for driving signals onto one or more conductors being tested. In one example, the driver 430 is coupled to respective channels that drive the testing signal onto two conductors—e.g., channels 130A, 130B in FIG. 1. Although not shown, the pluggable module 425 may also include ports for channels 130C, 130D and a communication interface for transmitting the received testing signal to the skew calculator 420 for processing.

The driver 430 uses a clock signal to generate the testing signals it drives onto the two conductors. For example, the driver 430 may use a clock signal in the form of a square wave to generate the testing signal discussed above—i.e., a 25 GHz edge that is refreshed at 1 kHz rate. However, as shown in FIGS. 2 and 3, this testing signal may result in calculating a skew that does not accurately reflect the performance of the conductors at higher frequencies—e.g., frequencies greater than 1 GHz.

To more accurately measure the skew for higher frequencies, the clock adjustor 435 include a programmable clock source 440. The clock source 440 may include one or more digital signal processing (DSP) operations that can be performed on a reference clock signal (e.g., a square wave). For example, the clock source 440 may include one or more clock multipliers and dividers that process the reference clock to generate a modified clock signal. The clock source 440 can be programmed to have any number of different configurations which each output a clock signal that corresponds to a different frequency response. The programmable clock source 440 may include hundreds or thousands of different configurations that each generate unique modified clock signals for input into the driver 430. The clock adjustor 435 may be a software application, firmware, hardware, or some combination thereof.

Figure 5:
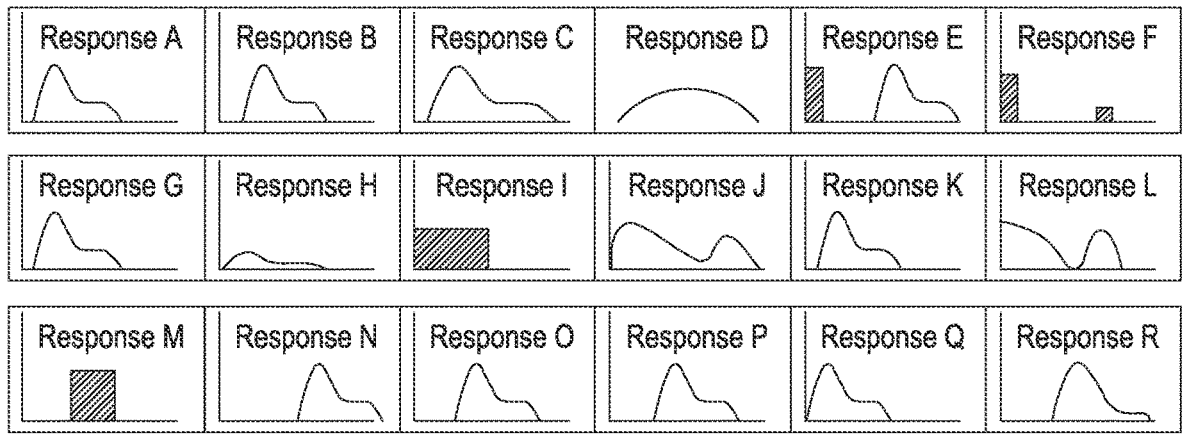
FIG. 5 illustrates frequency responses corresponding to a programmable clock source, according to one embodiment described herein.

FIG. 5 illustrates frequency responses corresponding to different configurations of the programmable clock source, according to one embodiment described herein. Put differently, each of the charts illustrates a frequency response from a respective configuration of the clock source. Thus, when processing the reference clock using a particular configuration, the resulting modified clock is unique relative to the resulting modified clock using any of the other configurations of the programmable clock source. Modifying the reference clock used by the driver using the clock source changes the frequency content of the testing signal generated by the driver. Thus, the frequency content of the testing signal driven by the driver onto the conductors being tested depends on which configuration of the clock source is selected. Ensuring accurate skew measurement for any particular conductor pair requires selecting a suitable configuration for those conductors.

Returning to FIG. 4, in one embodiment, the TDR 400 programs the clock source 440 based on input from a user. For example, the user may provide frequency information about the target system in which the conductors being tested will be used. Using this information, the TDR 400 programs the clock source 440 to output a modified clock signal that best matches the target system according to one or more criteria. Once selected, the TDR 400 can use the clock source 440 to generate the modified clock signal used by the driver 430 to output the testing signal on the conductors. By using a programmable clock source, the testing signal provided by the driver 430 includes frequency content that more closely matches the frequency content of the signals the target system will drive onto the conductor. Thus, the skew measurement generated by the skew calculator 420 may more accurately represent the skew of the conductors when used in the target system relative to a TDR that does not adjust the testing signal according to the intended use of the conductors.

The pluggable module 425 also includes logic 445 which may be software, firmware, hardware, or combinations thereof. The logic 445 stores a testing cycle refresh rate 450 which dictates the duration (i.e., frequency) of the sequential testing cycles generated by the driver 430 and/or the number of clock edges in these cycles. The logic 445 may set the refresh rate 450 according to parameters provided by a user or derive these parameters using frequency information about the target computing system.

Figure 6:
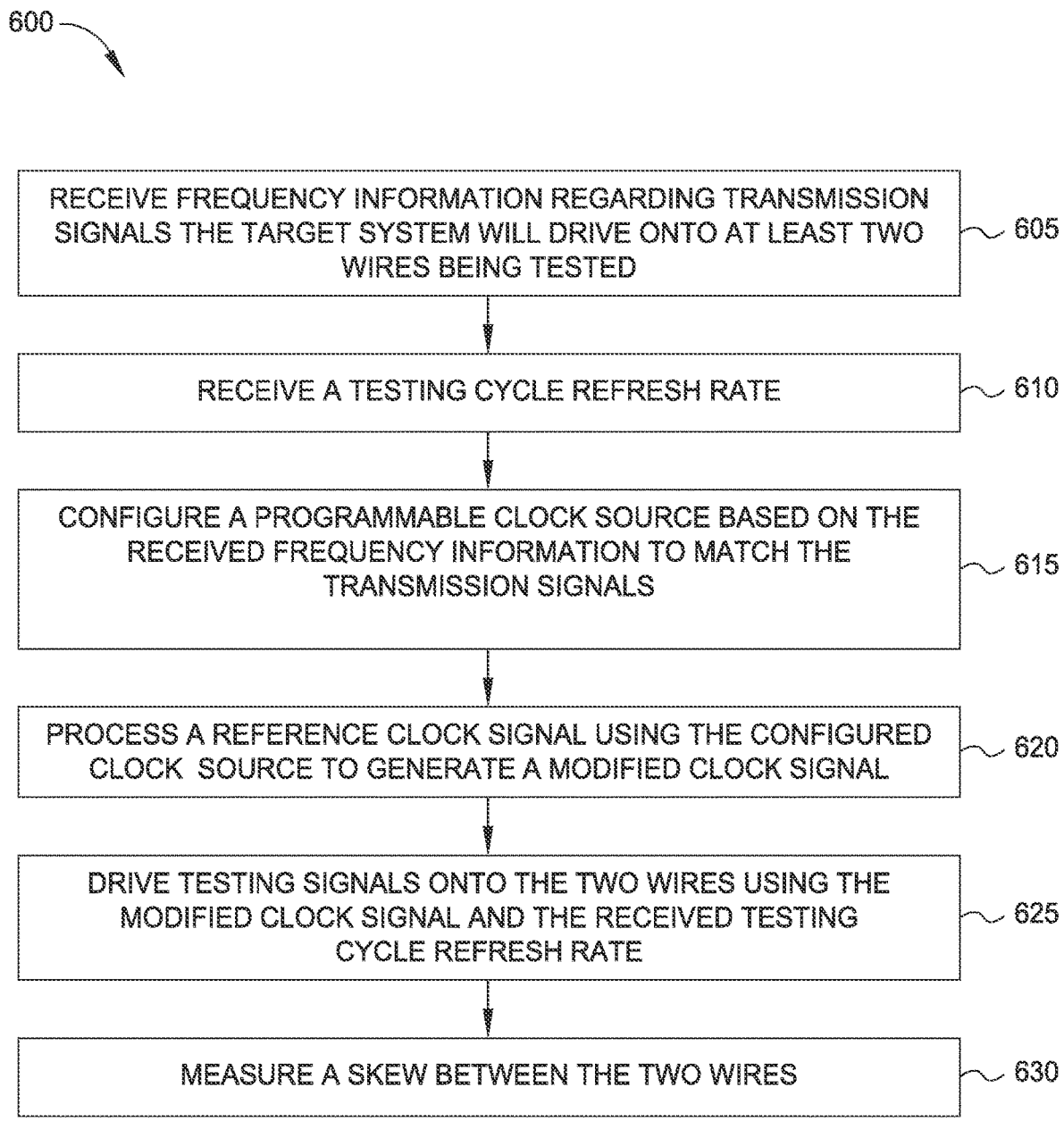
FIG. 6 is a flow chart for modifying a clock signal using a programmable clock source when measuring skew, according to one embodiment described herein.

FIG. 6 is a flow chart 600 for modifying a clock signal using a programmable clock source when measuring skew, according to one embodiment described herein. At block 605, a testing apparatus receives frequency information regarding transmission signals the target system will drive onto at least two conductors being tested. For example, the testing apparatus may rely on a user to input the frequency information into the testing apparatus. Some non-limiting examples of frequency information which the user may provide to the testing apparatus includes a frequency profile of a transmitter in the target system that will be connected to a cable containing the conductors, a desired frequency of the target system, or an impulse response or S-parameter of a channel which will include the conductors.

In one embodiment, instead of the user specifying frequency parameters directly in the frequency information, the testing apparatus may infer the frequency parameters using the information provided by the user. For example, the user may indicate the particular interface the cable will be connected to in the target interface. The testing apparatus may then use a look up table (or access the Internet) to identify the frequency profile of a transmitter in that interface. Thus, the frequency information received by the user may include direct reference to frequency parameters such as impulse response or S-parameters of a channel, or indirect reference to frequency parameters which can be derived or inferred by the testing apparatus.

At block 610, the testing apparatus receives a testing cycle refresh rate from the user. For example, the testing apparatus may include logic (e.g., hardware, software, or some combination thereof in the TDR head) that changes the refresh rate from a default setting based on user input. In one example, the testing signal may include sequential testing cycles driven onto the conductors. Using the simplistic example above, a testing cycle may include a high frequency edge (e.g., 25 GHz) that is repeated every 1 kHz. Instead of repeating the edge every 1 kHz, the user may instruct the testing apparatus to repeat the edge more frequently—e.g., 1 MHZ. Doing so may increase the power at higher frequencies which may provide a more accurate measurement of the skew. Similar to modifying the clock signal, changing the refresh rate of the testing cycles also changes the frequency content of the testing signal transmitted by the driver. Instead of being a single edge, the testing cycle may include multiple edges, edges with different slopes, etc. These testing cycles then repeat according to the refresh rate set at block 610.

In one embodiment, the testing apparatus includes one or more input/output devices for permitting the user to provide the frequency information and the desired testing cycle refresh rate at blocks 605 and 610. For example, the testing apparatus may include a keyboard, mouse, or touch interface for receiving user input. Moreover, the testing apparatus may include a display (or be communicatively coupled to a separate display) to output a user interface to aid the user when providing the frequency information and refresh rate.

In one embodiment, the testing apparatus may adjust the testing cycle refresh rate from a default rate using frequency information provided by the user. That is, instead of the user directly setting the testing cycle refresh rate, the testing apparatus may set the rate using frequency information about the target computing system as described above.

At block 615, a clock adjustor in the testing apparatus selects a configuration of the clock source based on the received frequency information. Specifically, the clock adjustor selects the configuration that matches the transmission signals in the target system according to one or more criteria. For example, if the frequency information provided by the user is an S-parameter, the clock adjustor may correlate each of the configurations of the clock source (which may be predefined) to a particular S-parameter value or range of values. In this manner, the clock adjustor is pre-configured to correlate the possible frequency information a user may provide to a particular configuration of the clock source. In another example, the user may provide two different types of frequency information—e.g., a frequency profile of a transmitter and an S-parameter of the channel. The clock adjustor may select a clock source configuration which has a frequency response that is a balance between the two types, even if the configuration does not have the exact same frequency profile or S-parameter. Thus, even though the selected configuration may not have the exact same frequency content as the transmission signal driven onto the conductors, the resulting testing signal better matches the frequency content of the transmission signal when compared to using a standardized testing signal without considering the intended use of the cable in the target system. Thus, the term "match" does not necessarily mean that the modified clock signal generated by the clock source configuration has the exact same frequency response as the transmission signal, but rather the clock source generates a testing signal that is a sufficiently close approximation of the transmission signals using in the target system. To determine which of the configurations is the best match, the clock adjustor may use any number of different criteria such as assigning specific values to the configurations (e.g., S-parameters or target frequencies), determining similarities in frequency content between signals generated by the clock source and the impulse response of the channel which will include the conductors, and the like.

In one embodiment, the clock adjustor selects the clock source configuration which ensures the primary frequencies in the transmission signal of the target system are above the noise floor of the testing apparatus. For example, the testing signal generated by one configuration may not have the same frequency content as the transmission signal, but it may be sufficient so long as the primary frequencies in the transmission signal (which may be identified by evaluating the frequency information received from the user) are above the noise threshold of the testing apparatus, and thus, affect the skew calculation.

In one embodiment, the user may directly select which configuration of the clock source to use. That is, instead of the clock adjustor using frequency information provided by the user to select a configuration, the user instructs the adjustor which configuration to use via a GUI or a command prompt. For example, the user may already know which clock source configuration is the best match for the transmission signals in the target system.

At block 620, the clock adjustor processes the reference clock signal using the selected clock source configuration to generate the modified clock signal. Generally, the clock source may use any number of DSP techniques to modify the reference clock in order to customize the frequency content in the clock. In one embodiment, the clock source processes the reference clock signal using various clock multipliers, clock dividers, and/or filters in a particular configuration to output the modified clock signal.

At block 625, a driver in the testing apparatus generates a testing signal using the modified clock signal and the received testing cycle refresh rate which it then drives onto the two conductors being tested. The modified clock signal and the refresh rate affect the frequency content in the testing signal, which, as discussed above, are altered to better match the frequency content of the transmission signal of the target system. In one embodiment, the testing apparatus may use only one of the clock source or the refresh rate to alter the frequency content of the testing signal rather than both as shown here in method 600.

In one embodiment, the testing apparatus drives the testing signal onto the two conductors simultaneously; however, this is not a requirement. For example, the testing apparatus may be able to drive the testing signal on the conductors at different times. For instance, a first conductor may be attached to the testing apparatus to determine the amount of time needed for the testing signal to propagate through the conductor and then a second conductor is attached to measure the amount of time required for the same testing signal to propagate to the end of the second conductor. The two times may then be evaluated to determine the skew.

Moreover, the two conductors may be part of a single-ended transmission cable or a differential pair cable. In another example, the two conductors may be different traces on a common substrate—e.g., a PCB—in a memory system (e.g., DRAM).

At block 630, the testing apparatus measures a skew between the two conductors based on the testing signal driven at block 625. Because the testing signal may more closely match the frequency content of the transmission signals in the target system, the skew may be more accurate compared to using a standardized (i.e., unchanging) testing signal.

Figure 7:
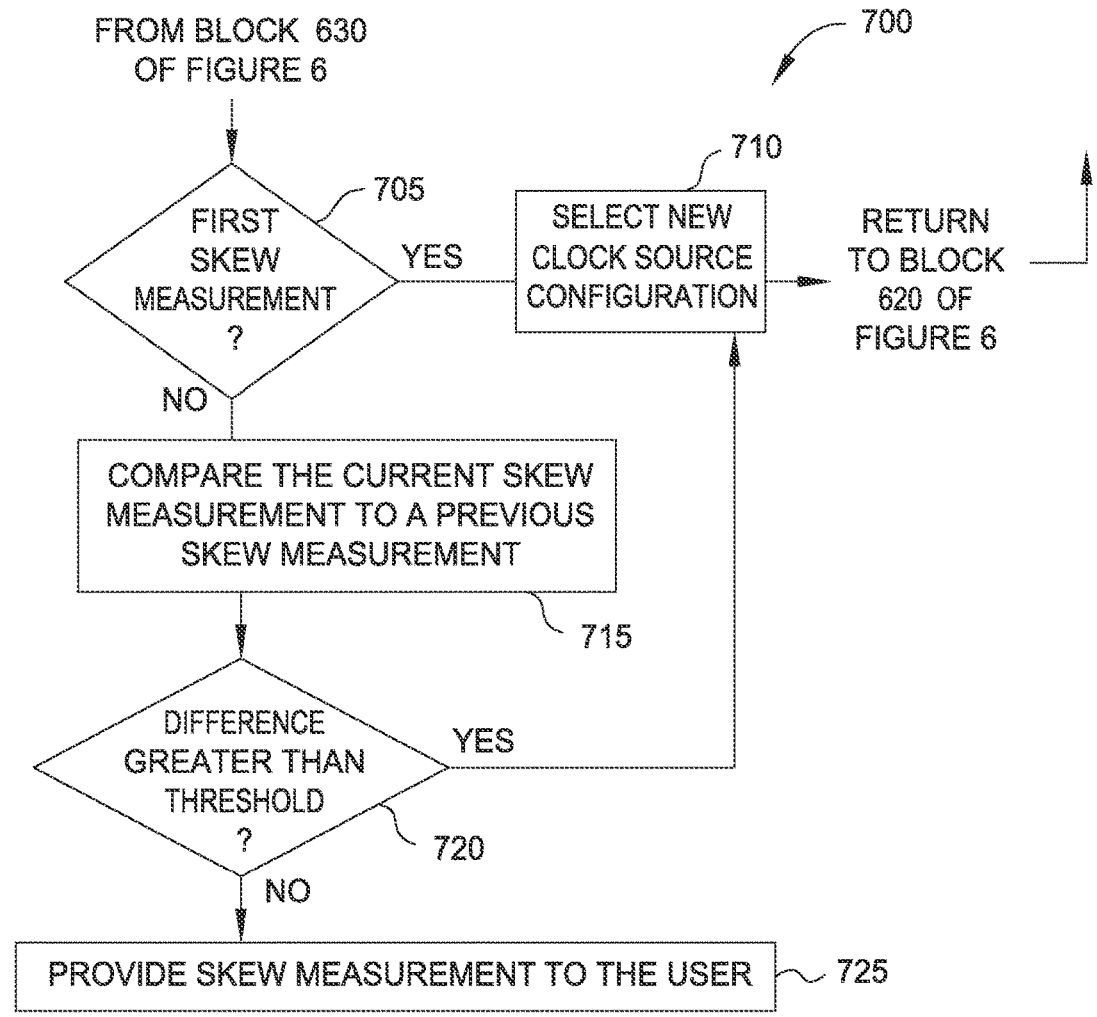
FIG. 7 is a flow chart for programming a clock source when measuring skew, according to one embodiment described herein.

FIG. 7 is a flow chart illustrating a method 700 for programming a clock source for measuring skew, according to one embodiment described herein. In one embodiment, method 700 may be performed to automatically determine the clock source configuration that should be used without using user input. As shown, method 700 begins after block 630 of FIG. 6 is complete and the testing apparatus has measured the skew. However, instead of receiving the frequency information from the user 605, the skew measurement may have been taken without the user providing any information about the target system. Alternatively, the user may have provided the frequency information to the testing apparatus, in which case method 700 may be used to ensure the clock source configuration selected at block 615 is the best match for the target system—i.e., to determine whether there is a clock source configuration that better matches the frequency content of the target system. For example, the user may have informed the testing apparatus that the cable will be used in a particular channel, but this information may be too vague for the testing apparatus to reliable determine that the selected clock source configuration is a sufficient match to the transmission signals used in the channel. As such, in one embodiment, the testing apparatus may use method 700 to determine if there is a configuration that is a better match.

At block 705, the testing apparatus determines whether the skew measurement was the first skew measurement for the conductors. If so, method 700 proceeds to block 710 where the clock adjustor selects a new clock source configuration with a new frequency response. For example, the clock adjustor may choose a configuration with a frequency response that most closely matches the frequency response of the clock source configuration used to obtain the first skew measurement. In one embodiment, the clock source configurations may be given similarity scores relative to the other configurations which can then be used by the clock adjustor to determine the configuration with the most similar frequency response and select which configuration to use next.

If the skew measurement was not the first skew measurement, method 700 proceeds to block 715 where the testing apparatus compares the current skew measurement to the previous skew measurement. For example, the testing apparatus may subtract the two skew measurements. If, at block 720, the testing apparatus determines the difference between the skew measurements exceeds a threshold (which may be set by the user), method 700 proceeds to block 710 where a new clock source configuration is selected. By determining whether the two skew measurements exceed the threshold, the testing apparatus can determine the similarity between the testing signal and the physical characteristics of the cable. If the testing signal generated by the clock source configurations are not a match for the cable, then the difference between the skew measurements will be large—i.e., exceed the threshold. The testing apparatus iterates through the configurations until two skew measurements are found whose difference is less than the threshold—i.e., the apparatus identifies the two best fitting clock source configurations. At block 725, the testing apparatus provides the skew measurement generated using one of these configurations to the user. Alternatively, the testing apparatus may average the two skew measurements and report this result to the user.

In one embodiment, instead of comparing only the current and previous skew measurements, the testing apparatus may compare multiple previous skew measurements to the current measurement. For example, the testing apparatus may maintain a running average, or calculate the standard deviation of the skew measurements. Once these values fall below a threshold, the testing apparatus may output one of the skew measurements (or a combination of the skew measurements) to the user at block 725.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference was made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a conductor.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method comprising:
    selecting a first clock source configuration for generating a first testing signal;
    adjusting a testing cycle refresh rate for generating the first testing signal based on the first clock source configuration, wherein adjusting the testing cycle refresh rate changes a frequency content of the first testing signal to more closely match a frequency content of a target computing system, as compared to a standardized testing signal, wherein the first testing signal includes sequential testing cycles, each testing cycle comprising a square wave with a predefined edge rate, and wherein the testing cycle refresh rate defines a duration of each of the sequential testing cycles and a frequency at which the sequential testing cycles repeat;
    driving the first testing signal using the adjusted testing cycle refresh rate onto a plurality of conductors by driving the first testing signal onto a first end of each respective conductor in the plurality of conductors, wherein the plurality of conductors are configured to be used in the target computing system;

detecting the first testing signal on a second end of each respective conductor in the plurality of conductors;

measuring a first measure of skew between at least two conductors of the plurality of conductors in response to detecting the first testing signal on the second end of each of the at least two conductors;

selecting a second clock source configuration for generating a second testing signal, based on determining that a similarity score between the first and second clock source configurations exceeds a first predefined threshold;

adjusting the testing cycle refresh rate to generate a second testing signal based on the second clock source configuration;

driving the second testing signal onto the plurality of conductors;

measuring a second measure of skew between the at least two of the plurality of conductors in response to detecting the second testing signal on the second end of each of the at least two conductors; and upon determining that a difference between the first and second measures of skew exceeds a second predefined threshold, selecting a third clock source configuration for generating a third testing signal.

2. The method of claim 1, further comprising:
receiving frequency information associated with the target computing system in which the plurality of conductors will be used.

3. The method of claim 2, wherein the testing cycle refresh rate is adjusted based on a similarity between the frequency information associated with the target computing system and the frequency content in the first testing signal generated using the adjusted testing cycle refresh rate.

4. The method of claim 1, further comprising:
configuring a programmable clock source, wherein each configuration of the programmable clock source corresponds to a respective frequency response different from frequency responses of other configurations of the programmable clock source; and
generating the first testing signal using an output of the configured programmable clock source and the adjusted testing cycle refresh rate.

5. The method of claim 1, wherein the driving and measuring are performed using a time domain reflectometer (TDR).

6. The method of claim 1, wherein the adjusting the testing cycle refresh rate comprises:
selecting one or more clock edges; and
selecting a frequency at which the clock edges repeat to generate sequential testing cycles.

7. The method of claim 1, wherein the first testing signal comprises sequential testing cycles, each testing cycle comprising a plurality of clock edges, and wherein the testing cycle refresh rate defines how frequently the testing cycle is repeated.

8. A testing apparatus, comprising logic configured to perform an operation comprising:
selecting a first clock source configuration for generating a first testing signal;
adjusting a testing cycle refresh rate for generating the first testing signal based on the first clock source configuration, wherein adjusting the testing cycle refresh rate changes a frequency content of the first testing signal to more closely match a frequency content of a target computing system, as compared to a standardized testing signal, wherein the first testing signal includes sequential testing cycles, each testing cycle comprising a square wave with a predefined edge rate, and wherein the testing cycle refresh rate defines a duration of each of the sequential testing cycles and a frequency at which the sequential testing cycles repeat;

driving the first testing signal using the adjusted testing cycle refresh rate onto a plurality of conductors by driving the first testing signal onto a first end of each respective conductor in the plurality of conductors, wherein the plurality of conductors are configured to be used in the target computing system;

detecting the first testing signal on a second end of each respective conductor in the plurality of conductors;

measuring a first measure of skew between at least two conductors of the plurality of conductors in response to detecting the first testing signal on the second end of each of the at least two conductors;

selecting a second clock source configuration for generating a second testing signal, based on determining that a similarity score between the first and second clock source configurations exceeds a first predefined threshold;

adjusting the testing cycle refresh rate to generate a second testing signal based on the second clock source configuration;

driving the second testing signal onto the plurality of conductors;

measuring a second measure of skew between the at least two of the plurality of conductors in response to detecting the second testing signal on the second end of each of the at least two conductors; and upon determining that a difference between the first and second measures of skew exceeds a second predefined threshold, selecting a third clock source configuration for generating a third testing signal.

9. The testing apparatus of claim 8, wherein the operation further comprises adjusting the testing cycle refresh rate based on receiving frequency information associated with the target computing system in which the plurality of conductors will be used.

10. The testing apparatus of claim 9, wherein the operation further comprises adjusting the testing cycle refresh rate based on a similarity between the frequency information associated with the target computing system and the frequency content in the first testing signal generated using the adjusted testing cycle refresh rate.

11. The testing apparatus of claim 8, further comprising:
a first port configured to connect to a first conductor of the plurality of conductors; and
a second port configured to connect to a second conductor of the plurality of conductors.

12. The testing apparatus of claim 8, further comprising a TDR.

13. The testing apparatus of claim 12, further comprising a pluggable TDR head in the TDR, wherein the logic is disposed in the pluggable TDR head.

14. The testing apparatus of claim 8, wherein the logic is configured to adjust the testing cycle refresh rate by:
selecting one or more clock edges, and
selecting a frequency at which the clock edges repeat to generate sequential testing cycles.

15. A computer program product for testing a plurality of conductors, the computer program product comprising:

a computer-readable storage medium having computer-readable program code embodied therewith, the computer-readable program code executable by one or more computer processors to:

select a first clock source configuration for generating a first testing signal;

adjust a testing cycle refresh rate for generating the first testing signal based on the first clock source configuration, wherein adjusting the testing cycle refresh rate changes a frequency content of the first testing signal to more closely match a frequency content of a target computing system, as compared to a standardized testing signal, wherein the first testing signal includes sequential testing cycles, each testing cycle comprising a square wave with a predefined edge rate, and wherein the testing cycle refresh rate defines a duration of each of the sequential testing cycles and a frequency at which the sequential testing cycles repeat;

drive the first testing signal using the adjusted testing cycle refresh rate onto a plurality of conductors by driving the first testing signal onto a first end of each respective conductor in the plurality of conductors, wherein the plurality of conductors are configured to be used in the target computing system;

detect the first testing signal on a second end of each respective conductor in the plurality of conductors;

measure a first measure of skew between at least two conductors of the plurality of conductors in response to detecting the first testing signal on the second end of each of the at least two conductors;

select a second clock source configuration for generating a second testing signal, based on determining that a similarity score between the first and second clock source configurations exceeds a first predefined threshold;

adjust the testing cycle refresh rate to generate a second testing signal based on the second clock source configuration;

drive the second testing signal onto the plurality of conductors;

measure a second measure of skew between the at least two of the plurality of conductors in response to detecting the second testing signal on the second end of each of the at least two conductors; and upon determining that a difference between the first and second measures of skew exceeds a second predefined threshold, select a third clock source configuration for generating a third testing signal.

16. The computer program product of claim 15, wherein the computer-readable program code is further executable to:

receive frequency information associated with the target computing system in which the plurality of conductors will be used.

17. The computer program product of claim 16, wherein the testing cycle refresh rate is adjusted based on a similarity between the frequency information associated with the target computing system and the frequency content in the first testing signal generated using the adjusted testing cycle refresh rate.

18. The computer program product of claim 15, wherein the plurality of conductors is disposed in a cable.

19. The computer program product of claim 15, wherein the adjusting the testing cycle refresh rate comprises:

selecting one or more clock edges; and selecting a frequency at which the clock edges repeat to generate sequential testing cycles.

20. The computer program product of claim 15, wherein the driving the first testing signal and measuring the first measure of skew are performed by a TDR.

* * * * *